United States Patent
Yao et al.

(10) Patent No.: US 11,742,043 B2
(45) Date of Patent: Aug. 29, 2023

(54) DYNAMIC RANDOM-ACCESS MEMORY (DRAM) TRAINING ACCELERATION

(71) Applicant: Advanced Micro Devices, Inc., Santa Clara, CA (US)

(72) Inventors: YuBin Yao, Shanghai (CN); Eric M. Scott, San Fransisco, CA (US); TieFeng Liu, Shanghai (CN)

(73) Assignee: Advanced Micro Devices, Inc., Santa Clara, CA (US)

( * ) Notice: Subject to any disclaimer, the term of this patent is extended or adjusted under 35 U.S.C. 154(b) by 11 days.

(21) Appl. No.: 17/506,746

(22) Filed: Oct. 21, 2021

(65) Prior Publication Data

US 2023/0132306 A1   Apr. 27, 2023

(51) Int. Cl.
*G11C 29/00* (2006.01)
*G11C 29/02* (2006.01)
(Continued)

(52) U.S. Cl.
CPC .......... *G11C 29/028* (2013.01); *G06F 3/0673* (2013.01); *G11C 7/1066* (2013.01); *G11C 7/222* (2013.01); *G11C 29/023* (2013.01)

(58) Field of Classification Search
CPC ..... G11C 7/222; G11C 29/028; G11C 29/023; G11C 7/1066; G11C 29/50012; G11C 7/1093; G11C 2207/2254; G11C 29/022; G11C 11/4076; G11C 7/1078; G11C 7/1051; G11C 29/02; G11C 7/22; G11C 8/18; G11C 7/1072; G11C 7/1087; G11C 7/109; G11C 7/1084; G11C 16/32; G11C 7/1057; G11C 11/4093; G11C 16/26; G11C 11/4096; G11C 7/04; G11C 11/401; G11C 11/409; G11C 5/063; G11C 2207/107; G11C 2207/2272; G11C 29/1201; G11C 29/12015; G11C 7/1006; G11C 8/10; G11C 29/50008; G11C 7/106; G11C 2029/4402;
(Continued)

(56) References Cited

U.S. PATENT DOCUMENTS 6,845,460 B2   1/2005   Lee et al.
6,889,334 B1   5/2005   Magro et al.
(Continued)

OTHER PUBLICATIONS

Zheng Gong, Rashid Rashidzadeh; "TSV Extracted Equivalent Circuit Model and an On-Chip Test Solution"; white paper; IEEE Transactions on Computer-Aided Design of Integrated Circuits and Systems; vol. 35, No. 4; Apr. 2016; 12 pages.

*Primary Examiner* — Thong Q Le
(74) *Attorney, Agent, or Firm* — Polansky & Associates, P.L.L.C.; Paul J. Polansky

(57) ABSTRACT

A method for performing read training of a memory channel includes writing a data pattern to a memory using a data bus having a predetermined number of bit lanes. An edge of a read data eye is determined individually for each bit lane by reading the data pattern over the data bus using a read bust cycle having a predetermined length, grouping data received on each bit lane over the read burst cycle to form a bit lane data group, and comparing the bit lane data group to corresponding expected data of the data pattern for each bit lane, logging a phase of each bit lane on which said edge is found, and repeating the reading, grouping, comparing, and logging until the edge is found for all of the bit lanes.

20 Claims, 5 Drawing Sheets

(51) Int. Cl.
  *G06F 3/06* (2006.01)
  *G11C 7/10* (2006.01)
  *G11C 7/22* (2006.01)

(58) Field of Classification Search
  CPC . G11C 2207/108; G11C 29/50; G11C 7/1063;
        G11C 13/004; G11C 16/10; G11C
        2207/105; G11C 2213/71; G11C 7/1069;
        G11C 7/1096; G11C 11/4072; G11C
        13/0004; G11C 13/0061; G11C 5/04;
        G11C 7/1048; G11C 11/4074; G11C
        11/5628; G11C 11/5642; G11C 2207/101;
        G11C 2211/5642; G11C 29/52; G11C
        29/56012; G11C 5/02; G11C 7/1012;
        G11C 7/20; G11C 8/06; G11C 11/40;
        G11C 11/5671; G11C 16/0483; G11C
        16/20; G11C 2029/0407; G11C 5/025;
        G11C 11/40611; G11C 11/4078; G11C
        2029/0411; G11C 21/00; G11C 2207/229;
        G11C 29/021; G11C 5/066; G11C 7/10;
        G11C 7/1009; G11C 7/1039; G11C
        7/1045
  USPC ....... 365/194, 193, 189.011, 189.05, 189.07,
        365/233.1, 189.04, 191, 201, 233.13,
        365/233.16, 233.17, 233.18, 149, 150,
        365/189.02, 189.12, 189.16, 198, 221,
        365/230.01, 230.02; 711/167, 100, 156,
        711/101, 104, 105, 110, 115, 163, 168,
        711/169, 170, 5
  See application file for complete search history.

(56) References Cited

U.S. PATENT DOCUMENTS

| | | |
|---|---|---|
| 7,924,637 B2 | 4/2011 | Searles et al. |
| 2004/0204912 A1* | 10/2004 | Nejedlo ............ G01R 31/3187 |
| | | 702/188 |

* cited by examiner

DYNAMIC RANDOM-ACCESS MEMORY (DRAM) TRAINING ACCELERATION

BACKGROUND

A data processing system includes a data processor such as a central processing unit (CPU) or a graphics processing unit (GPU) that executes instructions and manipulates data. The instructions and data are ultimately stored in a main memory system, which is typically isolated from the data processor. The data processor interacts with the memory system through a memory interface. The functioning of the memory interface is predominantly under the control of the data processor, and is typically performed by a memory controller integrated on the same silicon chip as the data processor.

The predominant type of main memory used in data processing systems today is dynamic random-access memory (DRAM) conforming to industry standard electrical and protocol specifications set forth by the Joint Electron Devices Engineering Councils (JEDEC), known as double data rate (DDR). There are many versions of the DDR standard, including graphics DDR (GDDR) versions that optimize the memory interface for the unique requirements of GPUs. Because of the high amount of main memory bandwidth used by GPUs, GDDR memory systems have pushed the envelope of speed and throughput. For example, a GDDR6 memory interface may operate at a clock speed of 16 gigaHertz (GHz), and because GDDR6 uses a 16-bit bus, the GDDR6 memory interface can achieve a data bandwidth of up to 64 giga-bytes per second (GB/s)

These high speeds necessitate that careful tuning of the timing of each data pin is individually adjusted relative to read and write clocks so that the memory device (for write cycles) and the data processor (for read cycles) are able to capture the data reliably. These timings are adjusted by the data processor using a process called training. Training is typically performed by the memory controller under control of firmware executing on the data processor. When the data processing is turned on, training can take up to several seconds. This amount of delay for startup training and as well as for periodic retraining during operation are noticeable and affect overall user experience.

Figure 1:
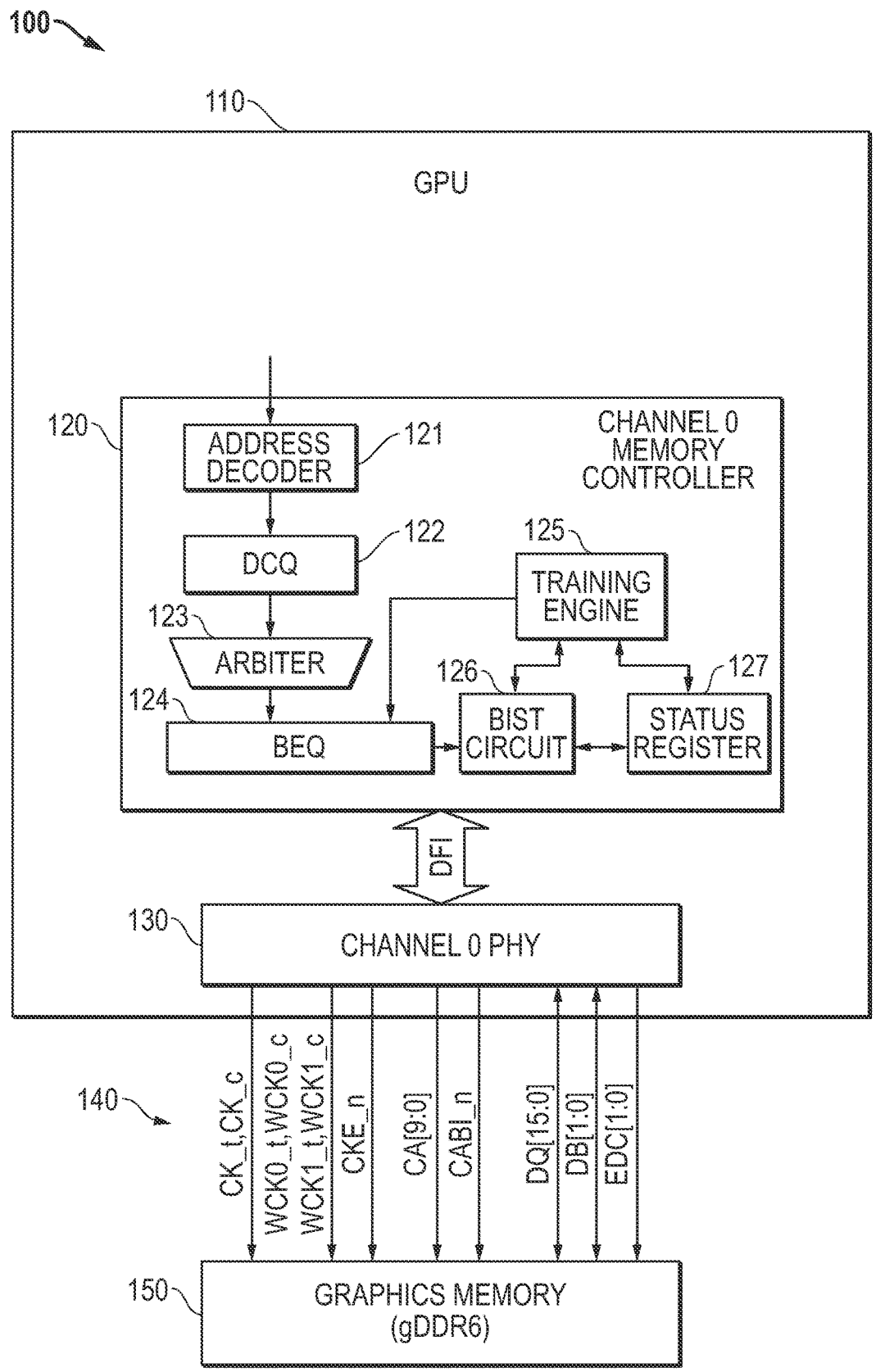
FIG. 1 illustrates in block diagram form a data processing system including a high-speed dynamic random-access memory (DRAM) according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A method for performing read training of a memory channel includes writing a data pattern to a memory using a data bus having a predetermined number of bit lanes. An edge of a read data eye is determined individually for each bit lane by reading the data pattern over the data bus using a read bust cycle having a predetermined length, grouping data received on each bit lane over the read burst cycle to form a bit lane data group, and comparing the bit lane data group to corresponding expected data of the data pattern for each bit lane, logging a phase of each bit lane on which the edge is found, and repeating the reading, grouping, comparing, and logging until the edge is found for all of the bit lanes.

A method for performing read training of a memory channel includes programming a memory with a data pattern using a burst write cycle having a predetermined length over a data bus having a predetermined number of bit lanes. The method further includes searching for a right edge of a read data eye for each bit lane by comparing received data bits transmitted on a corresponding bit lane for each beat of a corresponding burst read cycle having the predetermined length with corresponding expected data from the data pattern, and searching for a left edge of the read data eye for each bit lane by comparing received data bits transmitted on the corresponding bit lane for each beat of a corresponding burst read cycle with the corresponding expected data from the data pattern. A corresponding read delay is set for each bit lane independently based on corresponding left and right edges of the read data eye.

A memory controller includes a training engine and a built-in self-test (BIST) circuit. The training engine writes a data pattern to a memory using a data bus having a predetermined number of bit lanes. The built-in self-test (BIST) circuit is coupled to the training engine, and includes a selection circuit and a data comparison circuit. The selection circuit has an input for receiving the data pattern and forms a plurality of bit lane data groups of expected data for each bit lane wherein each bit lane data group includes a predetermined number of bits received on a corresponding bit lane during a read cycle. The data comparison circuit compares bits in each bit lane data group to corresponding received data, and has an output for providing a corresponding match signal for each data lane.

FIG. 1 illustrates in block diagram form a data processing system 100 including high-speed dynamic random-access memory (DRAM) according to some embodiments. Data processing system 100 includes generally a graphics processing unit 110 labelled "GPU", a memory channel 140, and a DRAM 150.

Graphics processing unit 110 includes a memory controller 120 and a physical interface circuit 130 labelled "PHY", as well as conventional components of a GPU that are not relevant to the training technique described herein and are not shown in FIG. 1. Memory controller 120 includes an address decoder 121, a command queue 122 labelled "DCQ", an arbiter 123, a back-end queue 124 labelled "BEQ", a training engine 125, a built-in self-test circuit 126 labelled "BIST", and a status register 127. Address decoder 121 has an input for receiving addresses of memory access request received from a variety of processing engines in graphics processing unit 110 (not shown in FIG. 1), and an output for providing decoded addresses. Command queue 122 has an input connected to the output of command queue 122, and an output. Arbiter 123 has an input connected to command queue 122, and an output. Back-end queue 124 has a first input connected to the output of arbiter 123, a second input, a first output, and a second output not shown in FIG. 1 for providing memory commands to physical interface circuit 130. Training engine 125 has a first output connected to the second input of back-end queue 124, a first bidirectional port, and a second bidirectional port. BIST circuit 126 has an input connected to the output of back-end queue 124, a bidirectional port connected to the first bidirectional port of training engine 125, and a second bidirectional port. Status register 127 has bidirectional port connected to the second bidirectional port of BIST circuit 126, and a second bidirectional port connected to the second bidirectional port of training engine 125.

PHY 130 has an upstream port bidirectionally connected to memory controller 120 over a bus labeled "DFI", and a downstream port. The DFI bus is compatible with the DDR-PHY Interface Specification that is published and updated from time-to-time by DDR-PHY Interface (DFI) Group.

Memory 150 is a memory especially suited for used with high-bandwidth graphics processors such as graphics processing unit 110, and is compatible with the Graphics Double Data Rate 6 (GDDR6) SGRAM Standard of the Joint Electron Devices Engineering Counsel (JEDEC) as standard JESD205C, published in Feb. 2021. Among other things, the standard defines a physical interface using a 16-bit data bus, optional data bus inversion (DBI) bits, error detection code bits, and separate differential read and write clocks in order to ensure high speed transmission per-pin bandwidth of up to 16 giga-bits per second (16 GB/s). The interface signals are shown in TABLE I below:

TABLE I

| Signal Name | Direction from PHY | Description |
| --- | --- | --- |
| CK_t, CK_c | Output | Clock: CK_t and CK_c are differential clock inputs. CK_t and CK_c do not have channel indicators as one clock is shared between both Channel A and Channel B on a device. Command Address (CA) inputs are latched on the rising and falling edge of CK. All latencies are referenced to CK. |
| WCK0_t, WCK0_c, WCK1_t, WCK1_c | Output | Write Clocks: WCK_t and WCK_c are differential clocks used for WRITE data capture and READ data output. WCK0_t/WCK0_c is associated with DQ[7:0], DBI0_n and EDC0. WCK1_t/WCK1_c is associated with DQ[15:8], DBI1_n and EDC1. The ball out has a WCK/byte but devices can be designed that support only a WCK/word. In the case of a WCK/word, for Channel A the WCK0_t and WCK0_c are active and the unused WCK1 clock is a NC; for Channel B the WCK1_t and WCK1_c are active and unused WCK0 clock is a NC. The WCK Granularity of the Vendor ID can be read to determine whether the device has been designed with a WCK/byte or a WCK/word. |
| CKE_n | Output | Clock Enable: CKE_n LOW activates and CKE_n HIGH deactivates the internal clock, device input buffers, and output drivers excluding RESET_n, TDI, TDO, TMS and TCK. Taking CKE_n HIGH provides PRECHARGE POWER-DOWN and SELF REFRESH operations (all banks idle), or ACTIVE POWER-DOWN (row ACTIVE in any bank). CKE_n must be maintained LOW throughout read and write accesses. |
| CA[9:0] | Output | Command Address (CA) Outputs: The CA outputs provide packetized DDR commands, address or other information, for example, the op-code for the MRS command. |
| DQ[15:0] | I/O | Data Input/Output: 16-bit data bus |
| DBI[1:0]_n | I/O | I/O Data Bus Inversion. DBI0_n is associated with DQ[7:0], DBI1_n is associated with DQ[15:8]. |
| EDC[1:0] | I/O | Error Detection Code. The calculated CRC data is transmitted on these signals. In addition these signals drive a 'hold' pattern when idle. EDC0 is associated with DQ[7:0], EDC1 is associated with DQ[15:8]. |
| CABI_n | Output | Command Address Bus Inversion |

In operation, memory controller 120 is a memory controller for a single channel, known as Channel 0, but GPU 110 may have other memory channel controllers not shown in FIG. 1. Memory controller 120 includes circuitry for grouping accesses and efficiently dispatching them to memory 150. Address decoder 121 receives memory access requests, and remaps the addresses relative to the address space of memory 150. Address decoder 121 may also optionally scramble or "hash" addresses in order to reduce the overhead of opening and closing pages in memory 150.

Command queue 122 stores the memory access requests including the decoded memory addresses as well as metadata such as quality of service requested, aging information, direction of the transfer (read or write), and the like.

Arbiter 123 selects memory accesses for dispatch to memory 150 according to a set of policies that ensure both high efficiency and fairness, for example, to ensure that a certain type of accesses does not hold the memory bus indefinitely. In particular, it groups accesses according to whether they can be sent to memory 150 with low overhead because they access a currently-open page, known as "page hits", and accesses that require the currently open page in the selected bank of memory 150 to be closed and another page opened, known as "page conflicts". By efficiently grouping accesses in this manner, arbiter 123 can partially hide the inefficiency caused by lengthy overhead cycles by interleaving page conflicts with page hits to other banks.

Back-end queue 124 gathers the memory accesses selected by arbiter 123 and sends them in order to memory 150 through physical interface circuit 130. It also multiplexes certain non-memory-access memory commands, such as mode register write cycles, refreshes, error recovery sequences, and training cycles with normal read and write accesses.

Physical interface circuit 130 includes circuitry to provide the selected memory access commands to memory 150 using proper timing relationships and signaling. In particular in GDDR6, each data lane is trained independently to determine the appropriate delays between the read or write clock signals and the data signals. The timing circuitry, such as delay locked loops, is included in physical interface circuit 130. Control of the timing registers, however, is performed by memory controller 120.

Memory controller 120 has circuitry for providing training sequences that physical interface circuit 130 provides to memory 150 during training. After training, memory controller 120 writes trained delays to registers in physical interface circuit 130 over the DFI interface to determine interim and final delay values. In order to achieve very high data transmission rates required by the GDDR6 standard, training engine 125 determines the timing of each data lane independently from all other data lanes. Memory controller 120 uses training engine 125 to control the training sequences, result determinations, and delay values for each data lane in hardware.

Known memory controller training sequences take a very long time at startup when initial values are being determined. The initial training sequence can be on the order of several seconds. A delay this long is noticeable and negatively impacts user experience.

In order to reduce the long initial training times, as well as periodic retraining times, memory controller 120 implements a built-in self-test (BIST) technique in which a built-in self-test circuit 126 collects a data pattern on each bit lane over a series of cycles, namely the number of cycles in a read burst. In GDDR6, a read burst is 16 cycles. BIST circuit 126 forms a bit lane data group in which the bit lane over each of the 16 cycles is combined into one data unit—known as the bit lane data group—and compared in hardware to the expected data. Training engine 125 performs this evaluation independently for each data lane until a data eye-edge is found for all groups.

In order to determine the center of the data eye, training engine 125 determines the right and left eye-edges, i.e., the amount of delay at which the data signal changes from a passing condition to a failing condition, and then picks the middle point between the right and left eye edges as the trained value for that particular data lane. Training engine 125 moves all the data phases at the same time, but then keeps track of which clock edge defines an edge of the data eye for each data lane. Further details of this technique with be explained in the remainder of this description. Memory controller 120 uses status register 127 to keep track of interim results and status of the training operation.

By performing many of the training steps in hardware rather than software, memory controller 120 reduces the amount of time required to perform both an initial training and retraining. For example, by combining data into a bit lane data group to collect data and evaluate results over a burst of 16 cycles, memory controller 120 is able to shorten training time by a factor of about 10. Moreover, the reduction in training time can be achieved with little extra added circuitry, as will be explained more fully with reference to a specific example of built-in self-test circuit 126 below.

Figure 2:
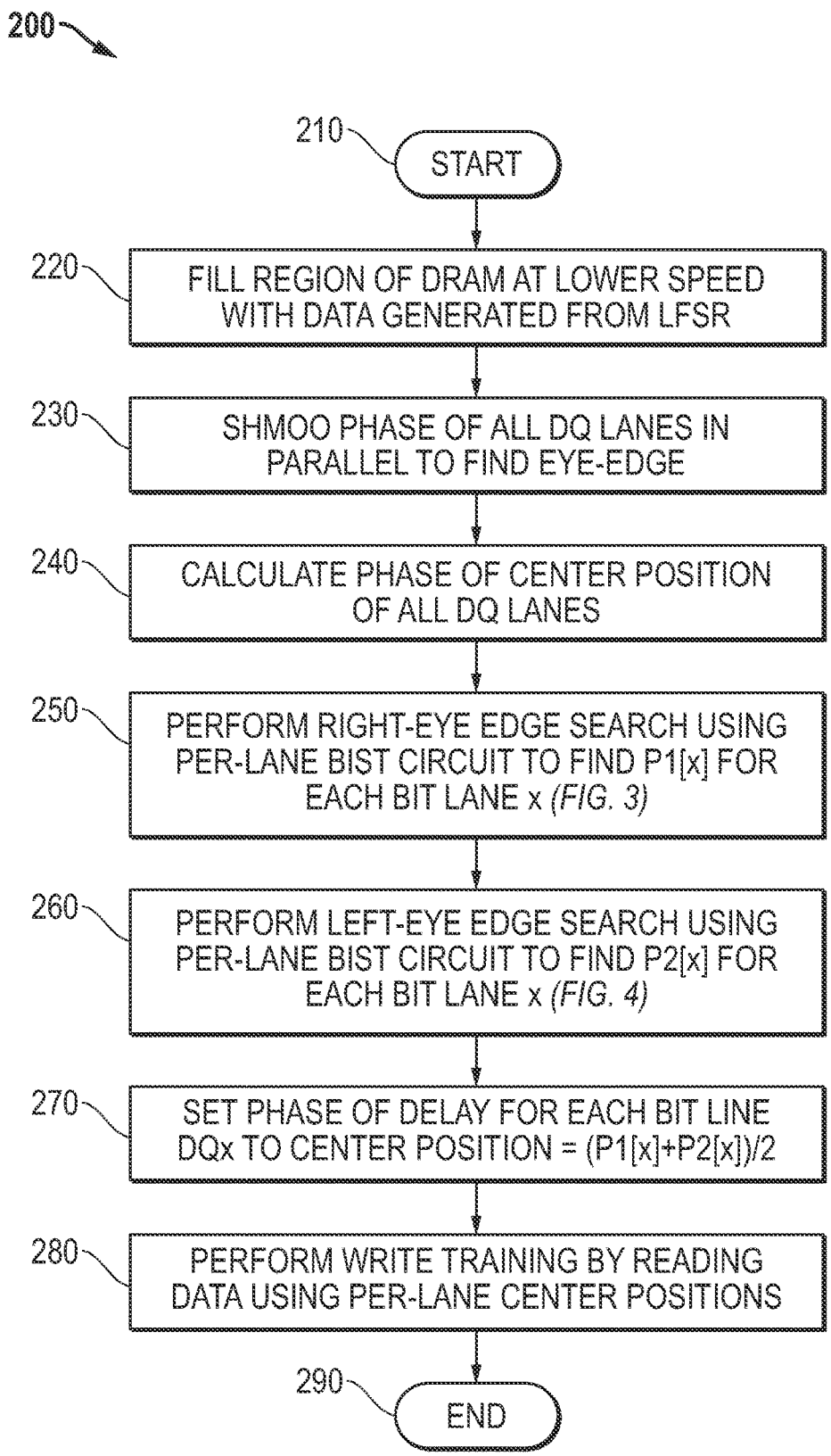
FIG. 2 illustrates a flow diagram of a master training sequence used by the memory controller of FIG. 1.

FIG. 2 illustrates a flow diagram of a master training sequence 200 used by memory controller 120 of FIG. 1.

Master training sequence 200 starts at an action box 210. In the example shown in FIG. 2, the start of master training sequence 200 is the startup of graphics processing unit 110, such as in response to turning the system power on.

In an action box 220, training engine 125 fills memory 150 with data at a lower speed. The lower speed is chosen so that timing is not critical, i.e., the write cycle will occur correctly so that any errors will represent read errors. Built-in self-test circuit 126 uses pseudo-random data generated from a linear feedback shift register (LFSR). This training pattern is actually deterministic, but causes the data to vary substantially across sixteen data lanes during the sixteen cycles in a read burst in a pattern that appears to be random.

In an action box 230, training engine 125 performs a "shmoo", i.e., a sweep of the timing phase, for all data lanes, and finds the "eye-edges", the right and left edges of passing values. In some embodiments, training engine 125 uses all data bits to find these initial eye-edges. In other embodiments, training engine 125 can use a single data bit, such as DQ0, as a representative of all data bits, to simplify the processing, provided that the worst-case lane-to-lane skew will be small enough that the data eye center position for DQ0 will be within the data eyes of all other DQ byte lanes.

In an action box 240, training engine 125 calculates the phase of the center position for all data lanes (or in some embodiments a single data bit). This phase is the midpoint between the left and right eye-edges.

In an action box 250, training engine 125 performs a right eye-edge search using built-in self-test circuit 126 and status register 127. In particular, it finds a phase value known as "P1[x]" at the eye-edge for each bit lane x. Since the center position of all bit lanes (or alternatively DQ0) is the starting point, the right eye-edge search incrementally adds delay values until the first failing value is determined independently for all the bit lanes. This procedure is detailed in FIG. 3 below.

In an action box 260, training engine 125 performs a left eye-edge search using built-in self-test circuit 126. In particular, it finds a phase value known as "P2[x]" at the eye-edge for each bit lane x. Since the center position of all bit lanes (or alternatively a single data bit) is the starting point, the left eye-edge search incrementally subtracts delay values until the first failing value is determined independently for all the bit lanes. This procedure is detailed in FIG. 4 below.

In an action box 270, training engine 125 sets the phase of the delay of each bit lane to the center of the data eye by calculating (P1[x]+P2[x])/2 for each bit lane x. Training engine 125 writes the values into the delay registers of physical interface circuit 130 according to the DFI protocol.

In an action box 280, memory controller 120 performs write data eye training using the per-bit-lane read training center positions that were determined above. Since the center positions were determined for each bit lane independently using the technique described above, the read portion of the write-read sequence is guaranteed to be successful. Thus, a success or failure of the write-read sequence is determined solely by whether the write data timing falls within the write date eye. This procedure can be done in a similar manner to the read procedure to find per-lane write edges and center positions.

In an action box 290, master training sequence 200 ends.

Figure 3:
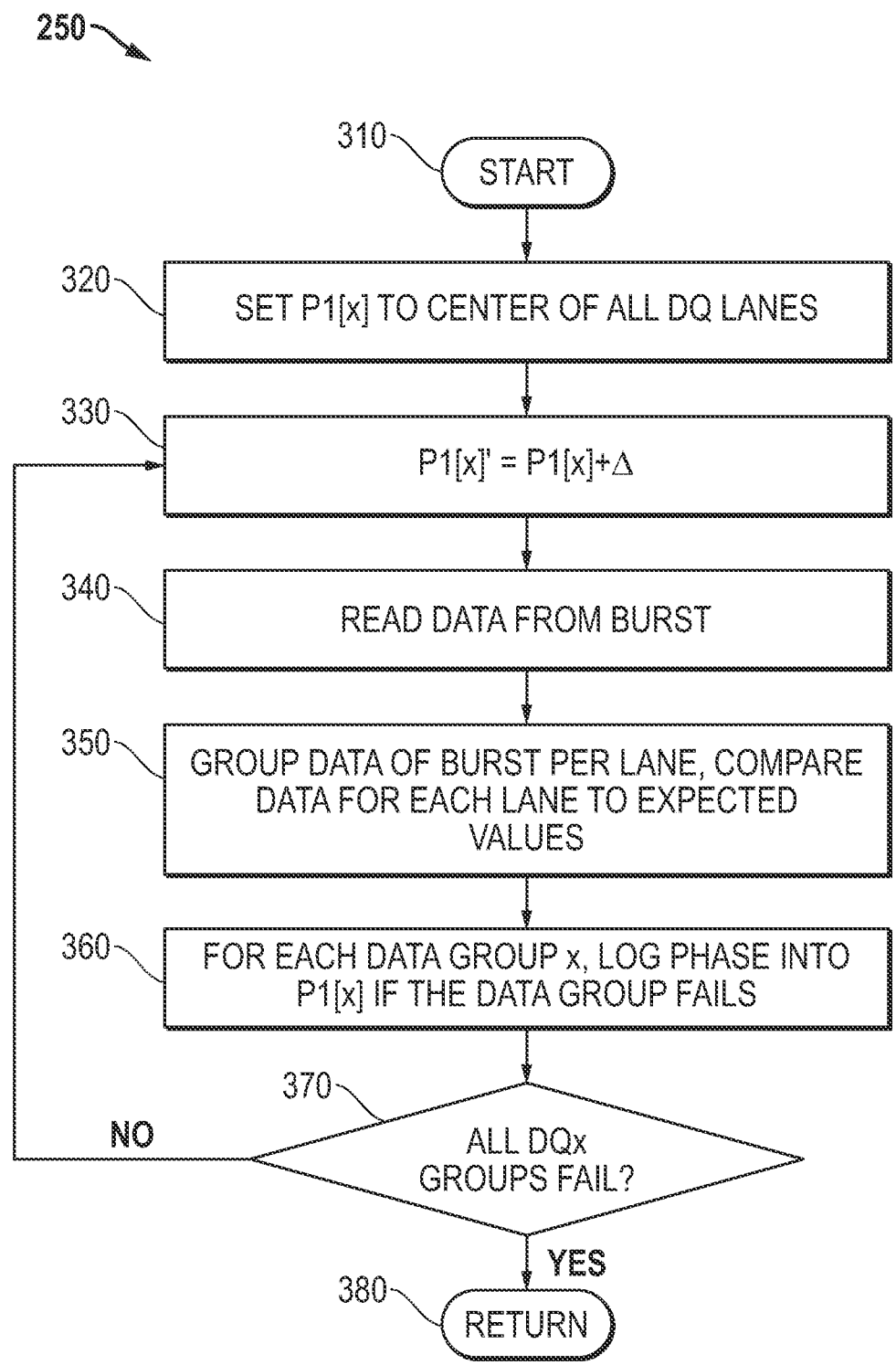
FIG. 3 illustrates a flow diagram of a right eye edge read training sub-sequence of the master training sequence of FIG. 2.

FIG. 3 illustrates a flow diagram of right eye-edge search 250 of master training sequence 200 of FIG. 2. Right eye-edge search 250 starts in an action box 310.

In an action box 320, training engine 125 sets P1[x] to the center of the data eye for all data lanes (or alternatively for DQ0).

In an action box 330, the new value of P1[x], designated P1[x]', is obtained by adding a unit phase amount Δ to P1[x].

In an action box 340, data is read from the burst address in memory 150 at which the pseudo-random pattern was stored in action box 220 of master training sequence 200. In GDDR6, a burst read is 16 cycles or "beats", each of which is 16 bits wide for a total of 256 data bits.

In an action box 350, built-in self-test circuit 126 groups data per data lane to form bit lane data groups. For example, the bit lane data group for data lane 0 is formed by DQ0, DQ16, and so on through the last bit, DQ240. The bit lane data group for data lane 1 is formed by DQ1, DQ17, and so on through the last bit, DQ241. The pattern repeats in this manner until the bit lane data group for data lane 15 is formed by DQ15, DQ31, and so on through the last bit, DQ255. The grouping may be performed implicitly by circuitry that compares certain bits of the burst transmitted using the same bit lane together, but by other means.

In an action box 360, for each data group x, for which x=0 to 15, the phase of each detected right eye-edge is logged into status register 127. Training engine 125, which controls the overall sequence, associates the phase P1[x] for each eye-edge found with the appropriate data lane.

In an action box 370, training engine 125 determines whether all groups have failed. If not, then the flow returns to action box 330 in which training engine 125 increments the phase and repeats the read cycle. If so, then the flow continues to action box 380.

In an action box 380, flow returns to master training sequence 200.

Figure 4:
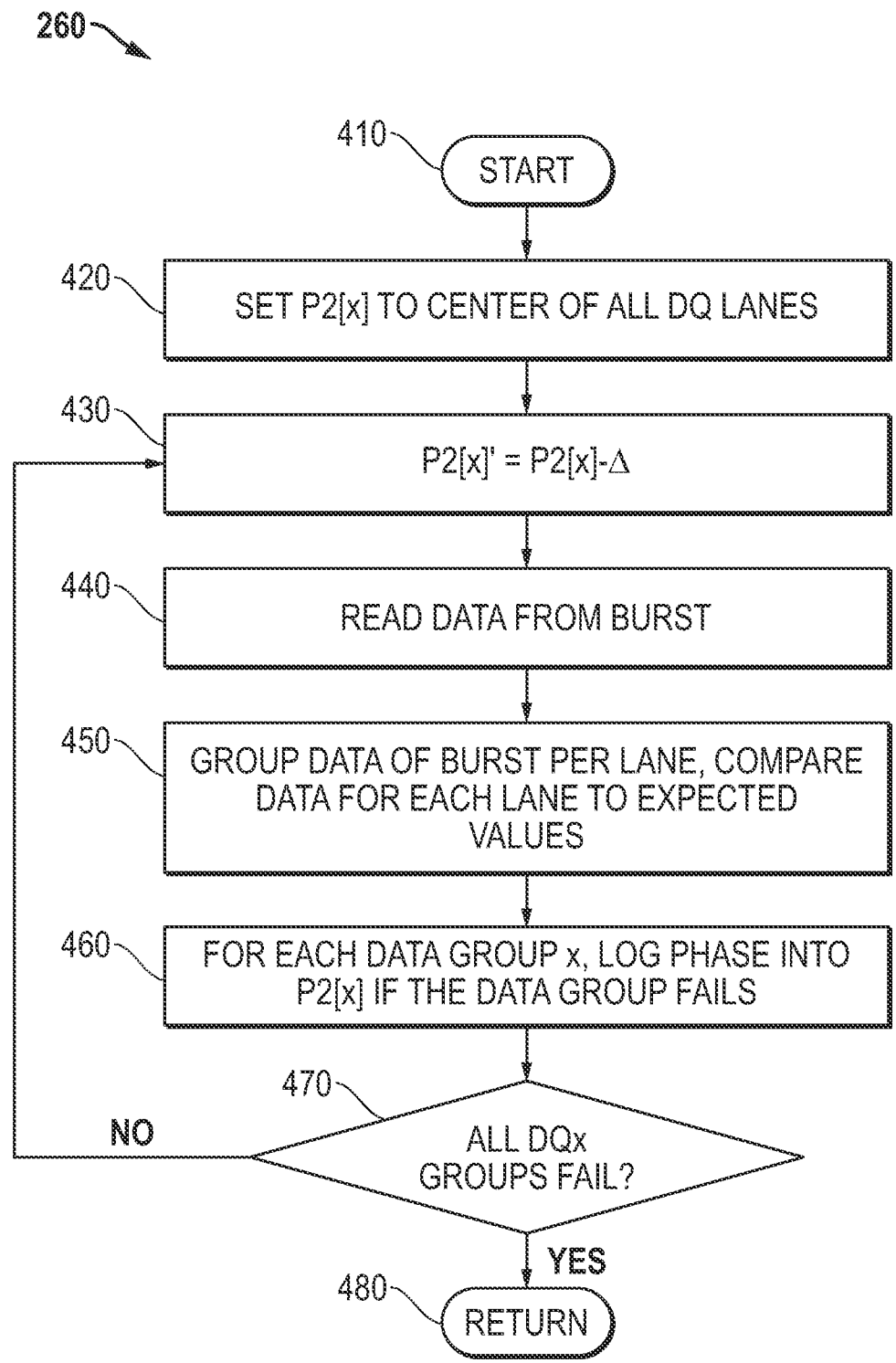
FIG. 4 illustrates a flow diagram of a left eye edge read training sub-sequence of the master training sequence of FIG. 2.

FIG. 4 illustrates a flow diagram of a left eye edge read training sub-sequence of the master training sequence of FIG. 2. Left eye edge read starts in an action box 410.

In an action box 420, training engine 125 sets P2[x] to the center of the data eye for all data lanes (or alternatively for DQ0).

In an action box 430, training engine 125 obtains the new value of P2[x], designated P2[x]', by subtracting a unit phase amount Δ from P2[x].

In an action box 440, memory controller 120 reads data from the burst address in memory 150 at which the pseudo-random pattern was stored in action box 220 of master training sequence 200.

In an action box 450, built-in self-test circuit 126 groups data per bit lane to form bit lane data groups, as described with respect to right eye-edge search 250 above.

In an action box 460, built-in self-test circuit 126 logs the phase of each detected left eye-edge that first fails into status register 127. Training engine 125, which controls the overall sequence, associates the phase P2[x] for each eye-edge found with the appropriate bit lane.

In an action box 470, training engine 125 determines whether all groups have failed. If not, then the flow returns to action box 330 in which training engine 125 increments the phase and repeats the read cycle. If so, then the flow returns to action box 380.

In an action box 480, flow returns to master training sequence 200.

In some embodiments, read training is applied to additional bit lane data groups for DBI[0] and DBI[1]. Memory 150 implements a feature known as data bus inversion. In order to save energy with consecutive transfers, memory controller 120 and memory 150 implement a selective data bus inversion for groups of eight data bits, in which case data bus inversion signal DBI[0] applies to DQ0-DQ7 and DBI[0] applies to DQ8-DQ15. Memory controller 120 and memory 150 selectively invert write data to bias the data toward the value of "0" and therefore save energy during a data transfer. If the number of bits of a byte that are transferred over memory channel 140 is greater than 4, i.e., more than half of the data bits are a "1", then back end queue 124 in memory controller 120 inverts write data sent to memory 150. Memory 150 then receives the data and stores it in true form by selectively de-inverting the bits according to the corresponding DBI bit. Thus the state of DBI[0] and DBI[1] are determined entirely by the logic states generated by the pseudo-random number generator. However including DBI[0] and DBI[1] in the training operation allows the timing of these signals to be tuned separately from the other bits.

In some embodiments, read EDC[1] and EDC[0] signals are also trained. EDC read training is done parallel with DQ/DBI write training, in which memory controller 120 performs a write cycle followed by a series of read cycles. Since DQ/DBI read training has already finished beforehand, any read EDC error during the reads means EDC is failing. The EDC error bits are ORed together to get the EDC bits. EDCERR[0] applies to the first eight beats of a burst and EDCERR[2] applies to the second eight beats of the burst for DQ[7:0], whereas EDCERR[1] applies to the first eight beats of a burst and EDCERR[3] applies to the second eight beats of the burst for DQ[15:8]. OR gate 516 ORs EDCERR[0] with EDCERR[2] to get REG_MIS_EDC[0], and EDCERR[1] with EDCERR[3] to get REG_MIS_EDC[1].

Figure 5:
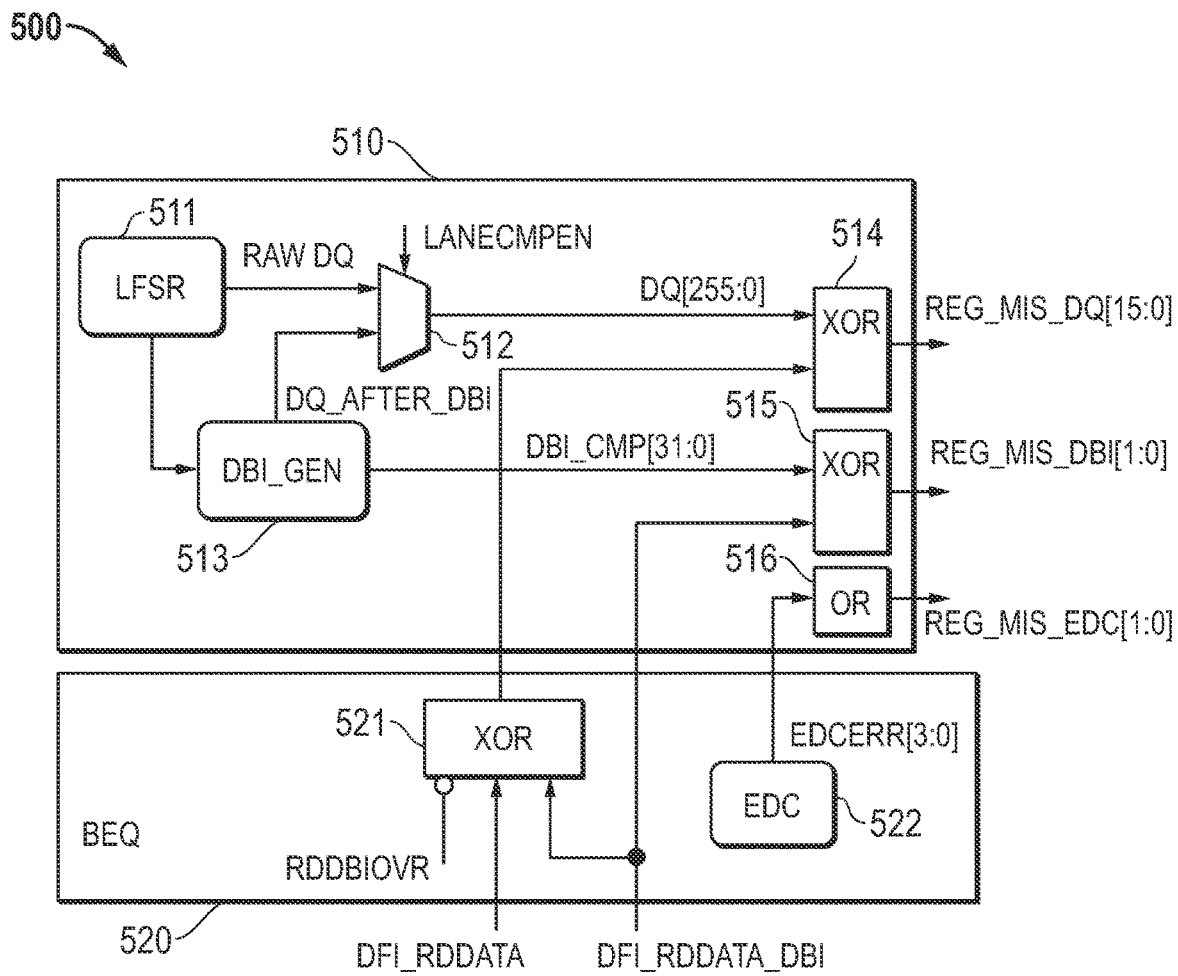
FIG. 5 illustrates in block diagram form a portion of the memory controller of FIG. 1.

FIG. 5 illustrates in block diagram form a portion 500 of the memory controller 120 of FIG. 1. Portion 500 includes a built-in self-test circuit 510 and a portion of a back-end queue 520 labelled "BEQ".

Built-in self-test circuit 510 includes a linear feedback shift register 511 labelled "LFSR", a selection circuit 512, a data bus inversion generator 513 labelled "DBI GEN", an exclusive-OR circuit 515 labelled "XOR", and an OR circuit 516 labelled "OR". Linear feedback shift register 511 has a first output for providing a signal labelled "RAW DQ", and a second output. Selection circuit 512 has a first input connected to the first output of linear feedback shift register 511, a second input, a control input for receiving a control signal labeled "LANECMPEN", and an output for providing a 256-bit data signal labelled DQ[255:0]. DBI generator 513 has an input connected to the output of linear feedback shift register 511, a first output connected to the second input of selection circuit 512 for providing a signal labelled "DQ_AFTER_DBI", and a second output for providing a signal labelled "DQI_CMP[31:0]". Exclusive-OR circuit 514 is a data comparison circuit having a first input connected to the output of selection circuit 512, a second input, and an output for providing a signal labelled "REG_MIS_DQ[15:0] to status register 127. Exclusive-OR circuit 515 is a DBI comparison circuit having a first input connected to the second output of data bus inversion generator 513, a second input for receiving a signal labelled DFI_RD-DATA_DBI, and an output for providing a signal labelled "REG_MIS_DBI[1:0]" to status register 127. OR circuit 516 has an input for receiving a signal labelled EDCERR[3:0], and an output for providing a signal labelled "REG_MIS_EDC[1:0]" to status register 127.

Back-end queue 520 includes an exclusive OR circuit 521 labelled "XOR", and an EDC circuit 522 labelled "EDC". Exclusive OR circuit 521 has a first active-low input for receiving a signal labelled "RDDIOVR", a second input for receiving a signal labelled "DFIRDDATA", a third input for receiving the DFI_RDDATA_DBI signal, and an output connected to the second input of exclusive-OR circuit 515. EDC circuit 522 has an output connected to the input of OR circuit 516 for providing the EDDERR[3:0] signal thereto.

In built-in self-test circuit 510, linear feedback shift register 511 calculates a 256-bit pseudo-random number based on the well-known linear feedback operate-and-shift technique. It provides this number, i.e., the RAWDQ signal, to an input of selection circuit 512 and 50 an input of data bus inversion generator 513. Selection circuit 512 selects between RAWDQ and DQ_AFTER_DBI provided by data bus inversion generator 513 based on the state of the LANECMPEN control bit. The output of selection circuit 512 is RAWDQ if LANECMPEN is 0, or DQ_AFTER_DBI if LANECMPEN is 1.

Exclusive OR circuit 514 is an implementation of a data comparison circuit having an array of 256 excusive-OR (XOR) gates, each receiving a bit of the pseudo-random number and a corresponding bit received during the read cycle and delivered to the BIST circuit through back-end queue 520. The outputs of the XOR gates of all of the 16 bits that make up a bit lane data group are input to a 16-input NOR gate, the output of which is high to indicate a successful comparison, and a low otherwise. These bits are sent to status register 127 as the 16-bit REG_MIS_DQ[15:0] signal. Exclusive-OR circuit 515 is an implementation of a data comparison circuit and includes thirty-two XOR gates. Sixteen of these thirty-two XOR gates compare the DBI[0] signal for each of the sixteen beats of the burst to the expected DBI[0] signal. The outputs of the XOR gates of all of the 16 bits that make up a bit lane data group are input to a 16-input NOR gate, the output of which is high to indicate a successful comparison, and a low otherwise. Likewise, the other sixteen of these thirty-two XOR gates compare the DBI[1] signal for each of the sixteen beats of the burst to the expected DBI[1] signal. The outputs of the XOR gates of all of the 16 bits that make up a bit lane data group are input to a 16-input NOR gate, the output of which is high to indicate a successful comparison, and a low otherwise. Exclusive-OR circuit 515 provides these two outputs as the REG MIS DBI[1:0] signal to status register 127. OR circuit 516 performs a logical OR between EDCERR[0] and EDCERR [2] to form the EDC[0] signal, and a logical OR between EDCERR[1] and EDCERR[3] to form the EDC[1] signal, and provides these signals as REG_MIS_EDC[1:0] to status register 127.

In back-end queue 520, exclusive OR circuit 521 performs an exclusive-OR operation on the DFI_RDDATA and a corresponding bit of the DFI_RDDATA_DBI if RDDBIOVR is low, and passes DFI_RDDATA to the output of exclusive OR circuit 521 is RDDBIOVR is 0. Exclusive OR circuit 521 allows the DBI operation to be overridden to, for example, save power in systems in which DBI is not implemented. EDC circuit 522 calculates four EDC ERROR bits, including EDCERR[0] for the first eight beats of the burst on the lower data byte, EDCERR[1] for the first eight beats of the burst on the upper data byte, EDCERR[2] for the second eight beats of the burst on the lower data byte, and EDCERR[3] for the second eight beats of the burst on the upper data byte.

Figure 6:
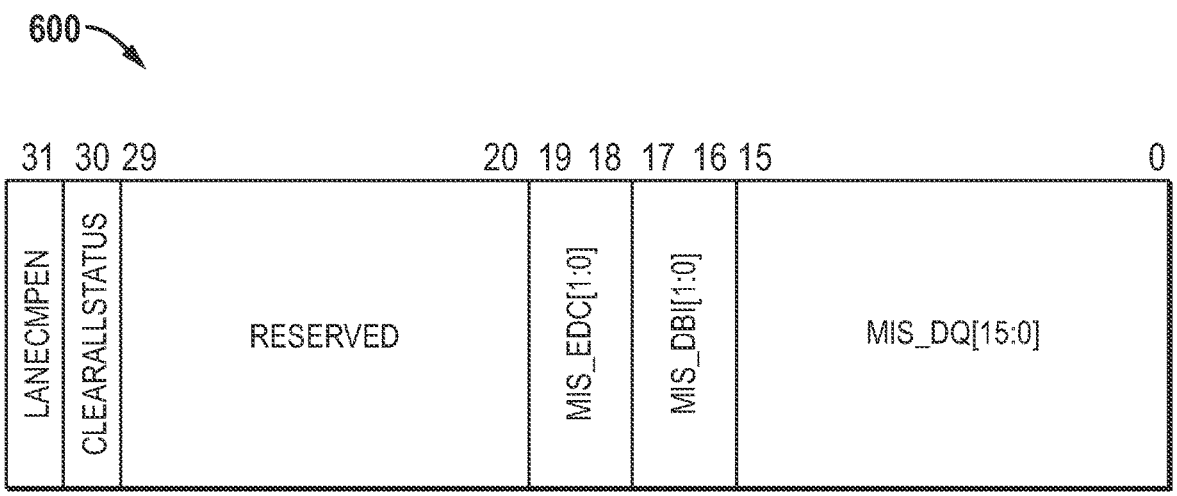
FIG. 6 illustrates a bit assignment of the status register of the memory controller of FIG. 1

FIG. 6 illustrates a bit assignment 600 of status register 127 of memory controller 120 of FIG. 1. Bit [31] is a read/write bit LANECMPEN that enables the per-lane comparison feature.

Bit [30] is a read/write bit CLEARALLSTATUS that when set to 1, clears all mismatch status bits, and will also clear error counters if they are implemented. This bit is self-clearing, and a read will always return a 0. Bits [29:20] are reserved. Bits [19:18] are read-only bits indicating a mismatch for EDC[1] and/or EDC[0]. Bits [17:16] are read-only bits indicating a mismatch for DBI[1] and/or DBI[0]. Bits [15:0] are read-only bits indicating a mismatch for data in a corresponding data lane.

An integrated circuit containing memory controller 120, including training engine 125, built-in self-test circuit 126, and status register 127 may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the initial value of the center of the data eye from which the right- and left-eye edges are found can be determined by either determining the composite data eye for all data bits, or by selecting a single data bit as an exemplary data bit. While the present application presented the example of a GPU accessing a GDDR6 memory because of the high memory read and write performance required, the techniques disclosed herein may be used for training for other types of data processors and other types of memory. Moreover, the order of the right and left eye-edge determinations may be reversed.

Accordingly, it is intended by the appended claims to cover all modifications of the disclosed embodiments that fall within the scope of the disclosed embodiments.

What is claimed is:

1. A method for performing read training of a memory channel comprising:
   writing a data pattern to a memory using a data bus having a predetermined number of bit lanes; and
   determining an edge of a read data eye individually for each bit lane by:
   reading said data pattern over said data bus using a read burst cycle having a predetermined length;
   grouping data received on each bit lane over said read burst cycle to form a corresponding bit lane data group;
   comparing said corresponding bit lane data group to expected data for each bit lane;
   logging a phase of each bit lane on which said edge is found; and
   repeating said reading, grouping, comparing, and logging until said edge is found for all of said bit lanes.

2. The method of claim 1, further comprises starting said determining at an approximate center of said read data eye.

3. The method of claim 2, further comprising:
   determining said approximate center by reading data from said predetermined number of bit lanes together.

4. The method of claim 2, further comprising:
generating said data pattern as a pseudo-random number using a linear feedback shift register.

5. The method of claim 2, wherein said determining said edge of said read data eye individually for each bit lane comprises:
determining a right edge of said read data eye for a first plurality of different delays from said approximate center to successively larger delays until said right edge of said read data eye is found; and
determining a left edge of said read data eye for a second plurality of different delays from said approximate center to successively smaller delays until said left edge of said read data eye is found.

6. The method of claim 5, further comprising:
setting a phase of a read delay for each bit lane to a center position of a corresponding right edge and a corresponding left edge for each bit lane.

7. The method of claim 6, further comprising:
performing write data eye training by writing data at various delays and reading data at said phase of said read delay for each bit lane.

8. A method for performing read training of a memory channel comprising:
programming a memory with a data pattern using a burst write cycle having a predetermined length over a data bus having a predetermined number of bit lanes;
searching for a right edge of a read data eye for each bit lane by comparing received data bits transmitted on a corresponding bit lane for each beat of a corresponding burst read cycle having said predetermined length with corresponding expected data from said data pattern;
searching for a left edge of said read data eye for each bit lane by comparing received data bits transmitted on said corresponding bit lane for each beat of a corresponding burst read cycle with said corresponding expected data from said data pattern; and
setting a corresponding read delay for each bit lane independently based on corresponding left and right edges of said read data eye.

9. The method of claim 8, further comprising:
generating said corresponding expected data comprises by de-multiplexing said data pattern based on a number of bit lanes in the memory channel.

10. The method of claim 8, further comprising:
determining an approximate center by reading data from said predetermined number of bit lanes together.

11. The method of claim 10, wherein said searching for said right edge of said read data eye for each bit lane comprises:
setting a delay for each bit lane to said approximate center;
incrementing said delay for each bit lane by a predetermined amount;
reading data using a burst read cycle having said predetermined length;
grouping data of said read burst cycle per bit lane;
comparing each group of data to said corresponding expected data from said data pattern;
logging a current phase into a bit lane right edge register if said comparing indicates a first failing value to said corresponding bit lane; and
repeating said incrementing, said reading data, said grouping data, said comparing, and said logging until all bit lane groups fail.

12. The method of claim 10, wherein said searching for said left edge of said read data eye for each bit lane comprises:
setting a delay for each bit lane to said approximate center;
decrementing said delay for each bit lane by a predetermined amount;
reading data using a burst read cycle having said predetermined length;
grouping data of said read burst cycle per bit lane;
comparing each group of data to said corresponding expected data from said data pattern;
logging a current phase into a bit lane right edge register if said comparing indicates a first failing value to said corresponding bit lane; and
repeating said decrementing, said reading data, said grouping data, said comparing, and said logging until all bit lane groups fail.

13. The method of claim 8, further comprising:
setting a phase of a read delay for each bit lane to a center position of a corresponding right edge and a corresponding left edge for each bit lane.

14. The method of claim 13, further comprising:
performing write data eye training by writing data at various delays and reading data at a respective center position for each bit lane.

15. A memory controller, comprising:
a training engine for writing a data pattern to a memory using a data bus having a predetermined number of bit lanes; and
a built-in self-test circuit coupled to said training engine, comprising:
a selection circuit having an input for receiving said data pattern for forming a plurality of bit lane data groups of expected data for each bit lane wherein each bit lane data group comprises a predetermined number of bits received on a corresponding bit lane during a read cycle; and
a data comparison circuit for comparing bits in each bit lane data group to corresponding received data, and having an output for providing a corresponding match signal for each data lane.

16. The memory controller of claim 15, wherein said built-in self-test circuit further comprises:
a linear feedback shift register for generating said data pattern.

17. The memory controller of claim 15, wherein said built-in self-test circuit further comprises:
a data bus inversion generation circuit responsive to said data pattern for generating a data bus inversion (DBI) code according to said data pattern and a predetermined DBI algorithm; and
a data bus inversion comparison circuit for comparing bits of said DBI code to received DBI signals, and having an output for providing a match signal for each DBI signal.

18. The memory controller of claim 17, wherein said predetermined DBI algorithm comprises:
a $DBI_{DC}$ pattern.

19. The memory controller of claim 17, wherein said predetermined DBI algorithm comprises:
a $DBI_{AC}$ pattern.

20. The memory controller of claim 17, further comprising:

a status register coupled to said training engine, having a plurality of fields for storing match signals for corresponding bit lanes.

\* \* \* \* \*